US012576628B2

(12) United States Patent
Takahashi et al.

(10) Patent No.: US 12,576,628 B2
(45) Date of Patent: Mar. 17, 2026

(54) METHOD FOR MANUFACTURING IMAGE DISPLAY DEVICE, PHOTOCURABLE RESIN COMPOSITION, AND LIGHT TRANSMITTING CURED RESIN LAYER

(71) Applicant: DEXERIALS CORPORATION, Tokyo (JP)

(72) Inventors: Hiroshi Takahashi, Tochigi (JP); Naoki Hayashi, Tochigi (JP); Naoto Sugawara, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 490 days.

(21) Appl. No.: 16/627,581

(22) PCT Filed: Jun. 20, 2018

(86) PCT No.: PCT/JP2018/023440
§ 371 (c)(1),
(2) Date: Dec. 30, 2019

(87) PCT Pub. No.: WO2019/004020
PCT Pub. Date: Jan. 3, 2019

(65) Prior Publication Data
US 2020/0148916 A1 May 14, 2020

(30) Foreign Application Priority Data
Jun. 28, 2017 (JP) ................................. 2017-125891

(51) Int. Cl.
*C09J 5/06* (2006.01)
*B32B 27/12* (2006.01)
(Continued)

(52) U.S. Cl.
CPC .............. *B32B 37/12* (2013.01); *B32B 27/12* (2013.01); *C08F 220/306* (2020.02);
(Continued)

(58) Field of Classification Search
CPC .... C09J 4/00; C08F 220/306; C08F 222/1065
See application file for complete search history.

(56) References Cited

U.S. PATENT DOCUMENTS

2016/0237281 A1* 8/2016 Miyamoto ........ G02F 1/133308

FOREIGN PATENT DOCUMENTS

JP 2013-190797 A 9/2013
JP 2014-095080 A 5/2014
(Continued)

OTHER PUBLICATIONS

Jan. 18, 2021 Office Action issued in Korean Patent Application No. 10-2019-7038123.
(Continued)

*Primary Examiner* — Eli D. Strah
(74) *Attorney, Agent, or Firm* — Oliff PLC

(57) ABSTRACT

A method for manufacturing an image display device capable of suppressing lifting phenomenon including: step (A): applying a photocurable resin composition to surfaces of a light transmitting optical member or an image display member forming a photocurable resin composition layer; step (B): irradiating the photocurable resin composition layer with light to form a pre-cured resin layer; step (C): bonding the image display member and the light transmitting optical member via the pre-cured resin layer; step (D): obtaining an image display device by irradiating light to the pre-cured resin layer to final-cure the pre-cured resin layer, thereby laminating the image display member and the light transmitting optical member via the light transmitting cured resin layer.

21 Claims, 7 Drawing Sheets

(51) Int. Cl.

| | |
|---|---|
| *B32B 37/12* | (2006.01) |
| *C08F 220/30* | (2006.01) |
| *C08F 220/34* | (2006.01) |
| *C08F 265/06* | (2006.01) |
| *C08F 290/06* | (2006.01) |
| *C09J 4/00* | (2006.01) |
| *C09J 4/06* | (2006.01) |
| *C09J 5/00* | (2006.01) |
| *C09J 11/06* | (2006.01) |
| *G02F 1/1333* | (2006.01) |
| *G09F 9/00* | (2006.01) |
| *H01L 27/32* | (2006.01) |
| *H01L 51/56* | (2006.01) |
| *H05B 33/04* | (2006.01) |
| *H05B 33/10* | (2006.01) |
| *H10K 50/00* | (2023.01) |
| *H10K 59/40* | (2023.01) |
| *H10K 59/80* | (2023.01) |

(52) U.S. Cl.
    CPC ........ *C08F 220/343* (2020.02); *C08F 265/06* (2013.01); *C08F 290/06* (2013.01); *C09J 4/00* (2013.01); *C09J 4/06* (2013.01); *C09J 5/00* (2013.01); *C09J 5/06* (2013.01); *C09J 11/06* (2013.01); *G02F 1/1333* (2013.01); *G09F 9/00* (2013.01); *H05B 33/04* (2013.01); *H05B 33/10* (2013.01); *H10K 50/00* (2023.02); *H10K 59/40* (2023.02); *H10K 59/8792* (2023.02); *B32B 37/1207* (2013.01); *B32B 2037/1253* (2013.01); *B32B 2457/20* (2013.01); *B32B 2457/202* (2013.01); *C09J 2301/416* (2020.08); *C09J 2433/00* (2013.01); *C09K 2323/03* (2020.08); *C09K 2323/035* (2020.08); *G02F 2202/28* (2013.01)

(56) References Cited

FOREIGN PATENT DOCUMENTS

| | | | | | |
|---|---|---|---|---|---|
| JP | 2014-119557 | A | | 6/2014 | |
| JP | 2015-223756 | A | | 12/2015 | |
| JP | 2016210638 | A | * | 12/2016 | |
| JP | 2017-048358 | A | | 3/2017 | |
| WO | WO-0242383 | A1 | * | 5/2002 | .......... C03C 25/106 |
| WO | 2009/054168 | A1 | | 4/2009 | |
| WO | 2011/045862 | A1 | | 4/2011 | |
| WO | 2016/080084 | A1 | | 5/2016 | |
| WO | WO-2017038845 | A1 | * | 3/2017 | ........... C08F 290/06 |

OTHER PUBLICATIONS

Oct. 25, 2021 Office Action issued in Korean Patent Application No. 10-2019-7038123.

Mar. 23, 2021 Office Action issued in Chinese Patent Application No. 201880055417.4.

Sep. 18, 2018 Search Report issued in International Patent Application No. PCT/JP2018/023440.

Sep. 18, 2018 Written Opinion of the International Searching Authority issued in International Patent Application No. PCT/JP2018/023440.

Jan. 4, 2022 Office Action issued in Taiwanese Patent Application No. 107122284.

Mar. 17, 2022 Office Action issued in Korean Patent Application No. 10-2022-7002512.

Nov. 29, 2022 Office Action issued in Korean Patent Application No. 10-2022-7002512.

* cited by examiner

METHOD FOR MANUFACTURING IMAGE DISPLAY DEVICE, PHOTOCURABLE RESIN COMPOSITION, AND LIGHT TRANSMITTING CURED RESIN LAYER

TECHNICAL FIELD

The present disclosure relates to a method for manufacturing an image display device by bonding and laminating an image display member such as a liquid crystal display panel and a light transmitting optical member such as a transparent protective sheet disposed on the surface of the display member via a light transmitting cured resin layer. This application claims priority on the basis of Japanese Patent Application No. 2017-125891 filed in Japan on Jun. 28, 2017, which is incorporated by reference herein.

BACKGROUND ART

In an image display device such as a liquid crystal display panel used for an information terminal such as a smartphone, a photocurable resin composition layer is formed by arranging a photocurable resin composition between an image display member such as a liquid crystal display panel or an organic EL panel and a light transmitting optical member. Thereafter, the photocurable resin composition layer is cured by irradiating the photocurable resin composition layer with light to form a light transmitting cured resin layer. In this way, image display devices are manufactured by bonding and laminating the image display member and the light transmitting optical member.

A light shielding layer is usually provided at a peripheral portion of the image display surface of the light transmitting optical member in order to improve the brightness and contrast of a display image. Therefore, the curing of the photocurable resin composition sandwiched between the light shielding layer and the image display member does not progress sufficiently, so that sufficient adhesive strength may not be obtained in some cases. As a result, there is a concern that separation between the light transmitting optical member and the image display member and invasion of moisture into the gap may deteriorate image quality.

Thus, for example, a method for manufacturing a display device has been proposed which includes a first irradiation step (pre-curing step) of irradiating light to an adhesive applied to at least one of a display panel and a substrate, a bonding step of bonding the display panel and the substrate after the first irradiation step, and a second irradiation step (final-curing step) of irradiating light to the adhesive after the bonding step (PLT 1).

CITATION LIST

Patent Literature

PLT1: International Publication No. WO 2009/054168

SUMMARY OF INVENTION

Technical Problem

When the image display member and the light transmitting optical member are bonded to each other after the pre-curing step of the photocurable resin composition, it is preferable that the surface layer portion of the pre-cured adhesive is as flat as possible from the viewpoints of more effective expression of the adhesive force with the members to be bonded and ensuring a sufficient adhesive area. In addition, in consideration of the reduction of damages caused by pressing against the image display member and the light transmitting optical member which are the adherends, it is preferable that the adherends can be adhered with a smaller bonding pressure. That is, the photocurable resin composition is preferably lower in elasticity.

However, in order to reduce the elasticity of the photocurable resin composition, the crosslinking density of the photocurable resin composition is also reduced. Further, when curing of the outermost surface of the photocurable resin composition layer in the pre-cured state is insufficient, a so-called lifting phenomenon occurs. This lifting phenomenon is considered to be caused by the fact that an uncured component such as a polymerizable monomer existing in an insufficiently cured region permeates into the resin in the cured region and swells, resulting in wrinkles.

This technology has been proposed in view of such a conventional situation, and provides a method for manufacturing an image display device capable of suppressing the lifting phenomenon. Also provided are a photocurable resin composition and a light transmitting cured resin layer.

Solution to Problem

As a result of intensive studies, the present inventors found that the above problem can be solved by containing a predetermined amount of a (meth)acrylate monomer having a ring structure as an acrylic monomer in the photocurable resin composition.

Specifically, a method for manufacturing an image display device according to the present technology includes the following steps (A) to (D), wherein the photocurable resin composition contains a total of 31 to 55 mass % of a radical polymerizable component containing an acrylic oligomer and an acrylic monomer and 40 to 66 mass % of a plasticizer, and contains 5 to 19 mass % of a (meth)acrylate monomer having a ring structure as the acrylic monomer, and the light transmitting cured resin layer has a shear storage modulus of 1,000 to 320,000 Pa.

Step (A)

A step of applying a photocurable resin composition to a surface of a light transmitting optical member or a surface of an image display member to form a photocurable resin composition layer.

Step (B)

A step of pre-curing by irradiating the photocurable resin composition layer with light to form a pre-cured resin layer.

Step (C)

A step of bonding the image display member and the light transmitting optical member via the pre-cured resin layer.

Step (D)

A step of obtaining an image display device by irradiating light to the pre-cured resin layer disposed between the image display member and the light transmitting optical member to final-cure the pre-cured resin layer, thereby laminating the image display member and the light transmitting optical member via the light transmitting cured resin layer.

A photocurable resin composition according to the present technology includes: a total of 31 to 55 mass % of a radical polymerizable component containing an acrylic oligomer and an acrylic monomer and 40 to 66 mass % of a plasticizer; and 8 to 19 mass % of a (meth)acrylate monomer having a ring structure as the acrylic monomer, wherein a shear storage modulus of the photocurable resin composition after curing is 1,000 to 320,000 Pa.

A light transmitting cured resin layer according to the present technology includes: a total of 31 to 55 mass % of a radical-polymerizable component containing an acrylic oligomer and an acrylic monomer, 40 to 66 mass % of a plasticizer, and 8 to 19 mass % of a (meth)acrylate monomer having a ring structure as the acrylic monomer, and having a shear storage modulus of 1,000 to 320,000 Pa.

Advantageous Effects of Invention

The present technology can suppress resin swelling by containing a predetermined amount of a (meth)acrylate monomer having a ring structure as an acrylic monomer in the photocurable resin composition, because, when the photocurable resin composition is pre-cured, an uncured component present in an insufficiently cured region of the photocurable resin composition is less likely to permeate into the cured resin due to the (meth)acrylate monomer having a ring structure as a bulky skeleton. That is, the present technology can suppress the lifting phenomenon.

DESCRIPTION OF EMBODIMENTS

Hereinafter, embodiments of the present invention will be described in detail. First, a method for manufacturing an image display device will be described in detail for each step in the order of the first embodiment and then the second embodiment with reference to the drawings.

First Embodiment

Step (A1)

The method for manufacturing an image display device includes a step (A1) of applying a photocurable resin composition to a surface of an image display member to form a photocurable resin composition layer.

Figure 1A:
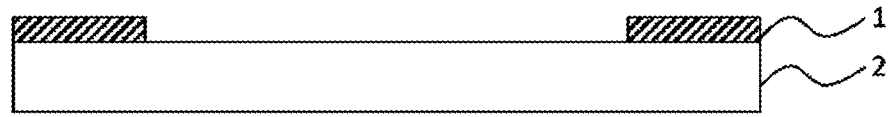
FIG. 1A is an explanatory view showing an example of a step (A1) of a method for manufacturing an image display device according to the present embodiment.
Figure 1B:
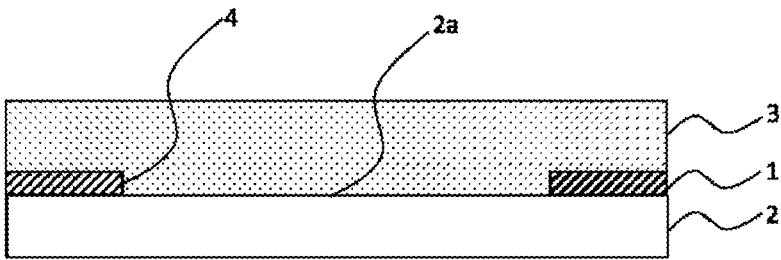
FIG. 1B is an explanatory view of a step (A1) of the method for manufacturing an image display device according to the present embodiment.

FIGS. 1A and 1B are explanatory views showing an example of step (A1) of the method for manufacturing an image display device. First, as shown in FIG. 1A, a light transmitting optical member 2 having a light shielding layer 1 formed on a peripheral portion of one side is prepared. Next, as shown in FIG. 1B, a photocurable resin composition layer 3 is formed by applying a photocurable resin composition to the surface 2a of the light transmitting optical member 2 to cancel a height difference 4 formed between the light shielding layer 1 and the light shielding layer-forming side surface 2a of the light transmitting optical member 2. Specifically, it is preferable to apply the photocurable resin composition to the entire surface of the light shielding layer-forming side surface 2a of the light transmitting optical member 2, including the surface of the light shielding layer 1, so that the resulting surface is flat without any height difference. The thickness of the photocurable resin composition layer 3 is preferably 1.2 to 50 times the thickness of the light shielding layer 1, and more preferably 2 to 30 times the thickness.

It should be noted that the application of the photocurable resin composition may be performed once or a plurality of times as long as a necessary thickness is achieved.

The light shielding layer 1 is provided, for example, to improve the contrast of an image. The light shielding layer 1 is formed by applying a paint colored black or the like by a screen printing method or the like, and drying and curing the paint. The thickness of the light shielding layer 1 is usually 5 to 100 μm. The thickness of the light shielding layer 1 corresponds to the height difference 4.

The light transmitting optical member 2 may be formed of any material as long as the material has a light transmitting property such that an image displayed on the image display member is visible. For example, a plate-like material or a sheet-like material such as glass, acrylic resin, polyethylene terephthalate, polyethylene naphthalate, and polycarbonate may be used, and a structure such as a touch panel in which sheet members are laminated may be used. These materials may be treated on one or both sides such as with a hard coating or anti-reflective treatment. Physical properties such as the thickness and elastic modulus of the light transmitting optical member 2 may be appropriately selected according to the purpose of use.

The photocurable resin composition is preferably in a liquid state. By using a liquid material, the height difference 4 formed between the light shielding layer 1 and the light shielding layer-forming side surface 2a of the light transmitting optical member 2 can be more reliably canceled. The term "liquid state" preferably means a state having a viscosity of 0.01 to 100 Pa*s at 25° C. as measured by a Brookfield type (B-type) viscometer.

The photocurable resin composition preferably contains a radical polymerizable component containing an acrylic oligomer and an acrylic monomer, a photopolymerization initiator, and a plasticizer.

The total content of the radical polymerizable component in the photocurable resin composition is 31 to 55 mass %, preferably 40 to 55 mass %.

The acrylic oligomer is a base material of the photocurable resin composition, and a (meth)acrylate oligomer having polyisoprene, polyurethane, polybutadiene and the like as a skeleton thereof is preferable. As used herein, the term (meth)acrylate includes both acrylate and methacrylate.

Specific examples of the (meth)acrylate oligomers having a polyisoprene skeleton include esterified products of polyisoprene polymer with maleic anhydride adduct and 2-hydroxyethyl methacrylate (product name: UC102 (molecular weight: 17,000 in terms of polystyrene) available from Kuraray; product name: UC203 (molecular weight: 35,000 in terms of polystyrene) available from Kuraray; and product name: UC-1 (molecular weight: 25,000) available from Kuraray), among others.

Examples of the (meth)acrylic-type oligomers having a polyurethane backbone include aliphatic urethane acrylate (EBECRYL 230 (molecular weight of 5,000) available from Daicel Allnex; and UA-1 available from Light Chemical Industry), among others.

As the (meth)acrylate oligomer having a polybutadiene skeleton, known oligomers may be employed.

The content of the acrylic oligomer in the photocurable resin composition is preferably 5 to 30 mass %. When two or more acrylic oligomers are used in combination, it is preferable that the total amount of the acrylic oligomers satisfies the above range.

The acrylic monomer is used as a reactive diluent for imparting sufficient reactivity and coating property, among other properties, to the photocurable resin composition in a manufacturing process of an image display device. The acrylic monomer contains at least a (meth)acrylate monomer having a ring structure, and may further contain other acrylic monomers. The content of the (meth)acrylate monomer having a ring structure in the photocurable resin composition is 5 to 19 mass %, may be 5 to 12 mass %, or may be 8 to 10 mass %. With this structure, the lifting phenomenon can be suppressed during the pre-curing of the photocurable resin composition layer.

The (meth)acrylate monomer having a ring structure preferably has at least one of an alicyclic hydrocarbon group, an aromatic hydrocarbon group, and a heterocycle as the ring structure. The (meth)acrylate monomer having a ring structure may be a monofunctional (meth)acrylate monomer or a polyfunctional (meth)acrylate monomer.

In the (meth)acrylate monomer having an alicyclic hydrocarbon group, the carbon number of the alicyclic hydrocarbon group is preferably 4 to 30, more preferably 4 to 20, and still more preferably 8 to 14. The alicyclic hydrocarbon group may have a monocyclic structure or a polycyclic structure, but preferably have a polycyclic structure. The alicyclic hydrocarbon group may be saturated or unsaturated. The alicyclic hydrocarbon group may have a substituent.

The (meth)acrylate monomer having an alicyclic hydrocarbon group preferably has a bridged alicyclic hydrocarbon group from the viewpoint of suppressing the lifting phenomenon. Specific examples include isobornyl (meth)acrylate, dicyclopentanyl (meth)acrylate, dicyclopentenyl (meth)acrylate, dicyclopentenyloxy (meth)acrylate, dicyclopentenyloxyethyl acrylate, adamantyl (meth)acrylate, 2-alkyl-2-adamantyl (meth)acrylate, 3-hydroxy-1-adamantyl (meth)acrylate, and 1-perfluoroadamantyl (meth)acrylate. Among these, dicyclopentenyloxyethyl acrylate, dicyclopentenyl acrylate, dicyclopentanyl acrylate, and isobornyl acrylate are preferred from the viewpoint of suppressing the lifting phenomenon.

In the (meth)acrylate monomer having an aromatic hydrocarbon group, the carbon number of the aromatic hydrocarbon group is preferably 6 to 30, and more preferably 6 to 18. The aromatic hydrocarbon group may have a monocyclic structure or a polycyclic structure. The aromatic hydrocarbon group may have a substituent.

Specific examples of (meth)acrylate monomers having an aromatic hydrocarbon group include monofunctional monomers such as benzyl (meth)acrylate, phenyl (meth)acrylate, phenoxyethyl (meth)acrylate, phenoxypolyethylene glycol (meth)acrylate, nonylphenoxypolyethylene glycol (meth)acrylate, phenoxypolypropylene glycol (meth)acrylate, 2-(meth)acryloyloxyethyl-2-hydroxypropyl phthalate, 2-hydroxy-3-phenoxypropyl (meth)acrylate, and polyfunctional monomers such as polycarbonate diol di (meth)acrylate, bisphenol A ethylene oxide adduct di (meth)acrylate, and bisphenol A propylene oxide adduct di (meth)acrylate. Among these, from the viewpoint of suppressing the lifting phenomenon, a monocyclic monomer is preferable, and specifically benzyl (meth)acrylate is preferable.

The (meth)acrylate monomer having a heterocyclic ring preferably has at least one of a nitrogen atom, an oxygen atom, and a sulfur atom as heterocyclic heteroatoms, and more preferably has an oxygen atom. The number of carbon atoms constituting the heterocycle is preferably 3 to 10, and more preferably 3 to 8. The heterocycle may be a monocyclic structure or a polycyclic structure. If the heterocyclic ring is a polycyclic structure, it may be condensed. The heterocycle may have a substituent.

Specific examples of the (meth)acrylate monomer having a heterocyclic ring include tetrahydrofurfuryl (meth)acrylate, 4-tetrahydropyranyl acrylate, and 2-tetrahydropyranyl methyl acrylate, wherein tetrahydrofurfuryl (meth)acrylate is preferred, and tetrahydrofurfuryl (meth)acrylate is more preferred. Only one kind of (meth)acrylate monomer having a ring structure may be used, or two or more kinds of acrylate monomers may be used in combination.

Examples of other acrylic monomers other than the (meth)acrylate monomer having a ring structure include linear or branched (meth)acrylate monomers. Specific examples include 2-hydroxypropyl methacrylate, 4-hydroxybutyl acrylate, lauryl acrylate, n-octyl acrylate, isodecyl acrylate, isostearyl acrylate, and octyl/decyl acrylate, among others.

The content of the other acrylic monomer in the photocurable resin composition is preferably 5 to 35 mass %. When two or more acrylic monomers are used in combination, it is preferable that the total amount thereof satisfies the above range.

As the photopolymerization initiator, a known photoradical polymerization initiator can be used. Examples include 1-hydroxy-cyclohexyl phenyl ketone (Irgacure 184, available from BASF), 2-hydroxy-1-{4-[4-(2-Hydroxy-2-methyl-propyronyl) benzyl] phenyl}-2-methyl-1-propane-1-one (Irgacure 127, available from BASF), benzophenone, and acetophenone, among others. Only one kind of photopolymerization initiator may be used, or two or more kinds may be used in combination.

The content of the photopolymerization initiator is preferably 0.1 to 5 parts by mass, more preferably 0.2 to 3 parts by mass, relative to the total 100 parts by mass of the radical polymerizable components. By setting such a range, it is possible to prevent insufficient curing at the time of ultraviolet irradiation and to prevent an increase in outgassing due to cleavage. When two or more photopolymerization initiators are used in combination, it is preferable that the total amount of the photopolymerization initiators satisfies the above range.

The plasticizer is used to impart buffering properties to the cured resin layer and to reduce the curing shrinkage ratio of the photocurable resin composition. Further, the plasticizer does not substantially react with the acrylic oligomer and the acrylic monomer when irradiated with ultraviolet rays. Examples of the plasticizer include a solid tackifier and a liquid oil component. Only one kind of plasticizer may be used, or two or more kinds of plasticizer may be used in combination.

Examples of solid tackifiers include terpene type resins such as terpene resins, terpene phenolic resins, and hydrogenated terpene resins, and rosin type resins such as natural rosin, polymerized rosin, rosin esters, and hydrogenated rosin, as well as terpene hydrogenated resins. In addition, non-reactive oligomers obtained by pre-polymerizing the above-mentioned acrylic monomers with a low molecular weight may also be used, and examples thereof include copolymers of butyl acrylate, 2-hexyl acrylate and acrylic acid, and copolymers of cyclohexyl acrylate and methacrylic acid, among others.

Examples of the liquid oil component include polybutadiene oil and polyisoprene oil.

The content of the plasticizer in the photocurable resin composition is 40 to 66 mass %, and may be 40 to 60 mass %. When two or more plasticizers are used in combination, it is preferable that the total amount thereof satisfies the above range.

The photocurable resin composition may further contain a chain transfer agent for adjusting the molecular weight. Examples of chain transfer agents include 2-mercaptoethanol, lauryl mercaptan, glycidyl mercaptan, mercaptoacetic acid, 2-ethylhexyl thioglycolate, 2,3-dimethylcapto-1-propanol, and α-methylstyrene dimer.

The photocurable resin composition may further contain an adhesion improving agent such as a silane coupling agent and an additive such as an antioxidant as required.
Step (B1)

In step (B1), the photocurable resin composition layer formed in step (A1) is irradiated with light to perform a pre-curing, thereby forming a pre-cured resin layer.

Figure 1C:
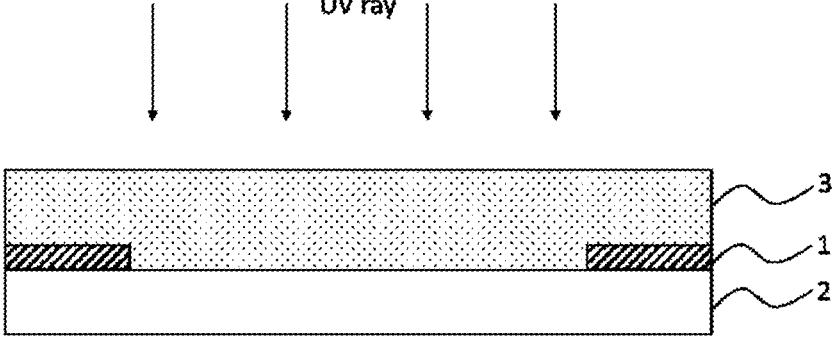
FIG. 1C is an explanatory view of a step (B1) of the method for manufacturing an image display device according to the present embodiment.
Figure 1D:
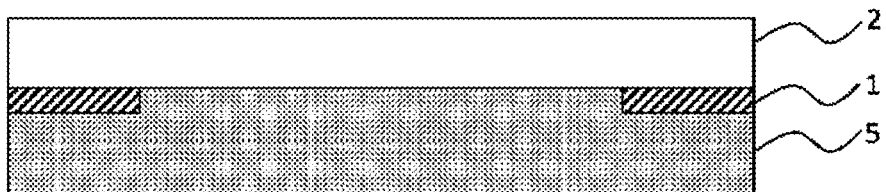
FIG. 1D is an explanatory view of a step (B1) of the method for manufacturing an image display device according to the present embodiment.

FIGS. 1C and 1D are explanatory views showing an example of the step (B1) of the method for manufacturing an image display device. As shown in FIG. 1C, the photocurable resin composition layer 3 formed in step (A1) is irradiated with light (preferably ultraviolet light) to perform pre-curing, thereby forming the pre-cured resin layer 5. The purpose of the pre-curing of the photocurable resin composition layer 3 is to change the state of the photocurable resin composition from a liquid state to a substantially nonflowable state to improve the handling property by preventing the photocurable resin composition from flowing out even when the top and bottom are reversed as shown in FIG. 1D. Further, by performing the pre-curing, the light transmitting cured resin layer 3 between the light shielding layer 1 and the image display member can be sufficiently cured with light without being removed from therebetween, and curing shrinkage can be reduced.

The pre-curing of the photocurable resin composition layer 3 is preferably performed so that the curing rate (gel fraction) of the pre-cured resin layer 5 is 10 to 90%, more preferably 40 to 90%, and still more preferably 70 to 90%. Here, the curing rate (gel fraction) is a numerical value defined as a ratio (consumption rate) of the amount of (meth)acryloyl group present in the photocurable resin composition layer after the ultraviolet irradiation to the amount of (meth)acryloyl group present before the ultraviolet irradiation, and the larger this numerical value is, the more curing progresses.

Specifically, the curing rate (gel fraction) can be calculated by substituting an absorption peak height (X) of 1,640 to 1,620 $cm^{-1}$ from the baseline in the FT-IR measurement chart of the photocurable resin composition layer before ultraviolet irradiation and an absorption peak height (Y) of 1,640 to 1,620 $cm^{-1}$ from the baseline in the FT-IR measurement chart of the photocurable resin composition layer after ultraviolet irradiation into the following equation:

$$\text{Curing rate } (\%) = [(X-Y)/X] \times 100.$$

The conditions of the ultraviolet irradiation such as the type of the light source, output power, illuminance, integrated light quantity, and the like are not particularly limited as long as the curing rate (gel fraction) of the pre-curing is preferably 10 to 90%, and a known photoradical polymerization process condition of (meth)acrylate by ultraviolet irradiation can be employed. In particular, ultraviolet irradiation is preferably performed using a UV-LED under a condition of an illuminance of 100 to 300 $mW/cm^2$ and an integrated light quantity of 100 to 300 $mJ/cm^2$.

Further, a condition of the ultraviolet irradiation is preferably selected so that no dripping or deformation of the pre-cured resin layer 5 occurs during the laminating process in step (C1) to be described later within the range of the above curing rate. For example, the viscosity is preferably 20 Pa*S or more (cone plate rheometer, 25° C., cone and plate C 35/2, rotation speed 10 rpm).
Step (C1)

In step (C1), the image display member and the light transmitting optical member are bonded to each other via the pre-cured resin layer.

Figure 1E:
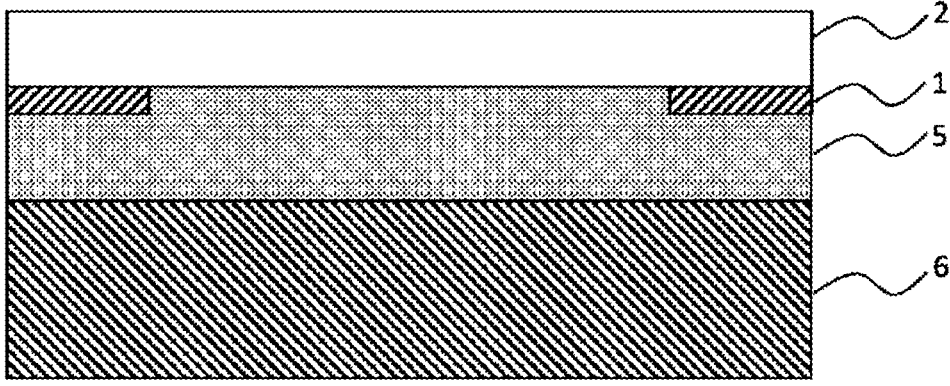
FIG. 1E is an explanatory view of a step (C1) of the method for manufacturing an image display device according to the present embodiment.

FIG. 1E is an explanatory view showing an example of the step (C1) of the method for manufacturing an image display device. As shown in FIG. 1E, the light transmitting optical member 2 is bonded to the image display member 6 on the side of the pre-cured resin layer 5. The bonding can be carried out, for example, by applying pressure at 10 to 80° C. using a known pressure bonding device.
Step (D1)

In step (D1), the pre-cured resin layer disposed between the image display member and the light transmitting optical member is irradiated with light and is final-cured, whereby the image display member and the light transmitting optical member are laminated via the light transmitting cured resin layer to complete an image display device.

Figure 1F:
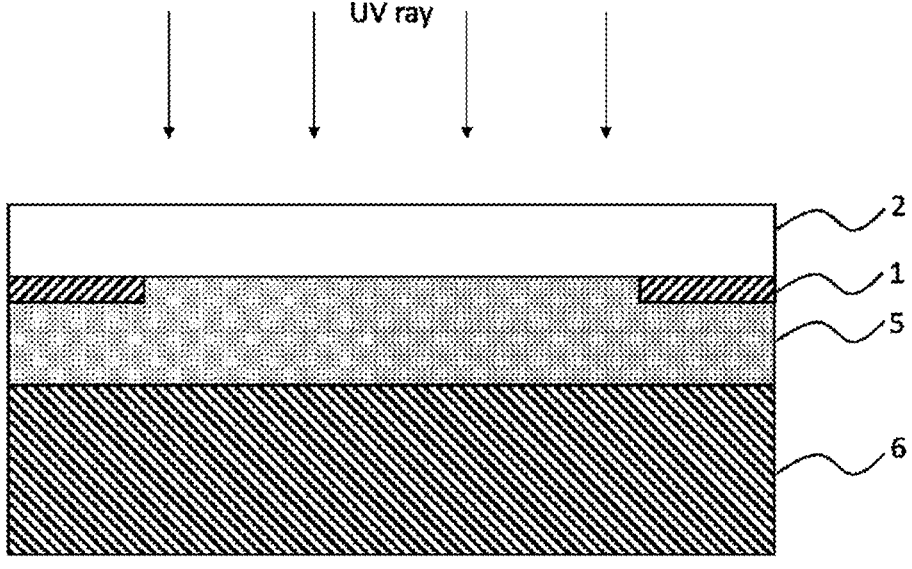
FIG. 1F is an explanatory view of a step (D1) of the method for manufacturing an image display device according to the present embodiment.
Figure 1G:
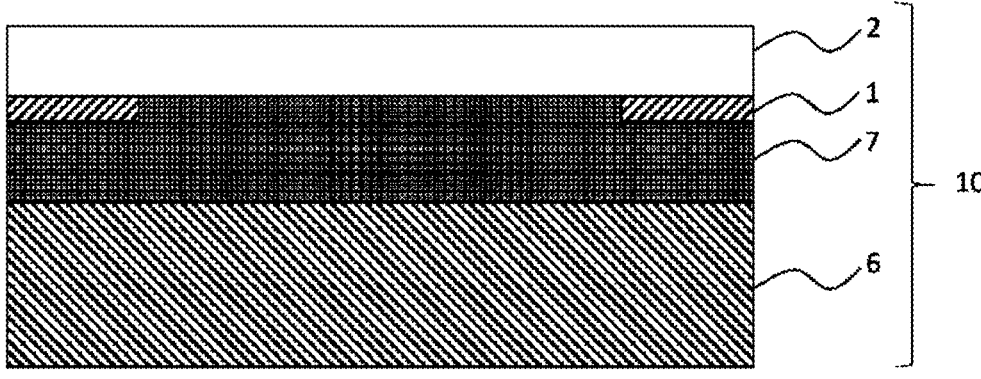
FIG. 1G is an explanatory view of a step (D1) of the method for manufacturing an image display device according to the present embodiment.

FIGS. 1F and 1G are explanatory views showing an example of the step (D1) of the method for manufacturing an image display device. As shown in FIG. 1F, the pre-cured resin layer 5 sandwiched between the image display member 6 and the light transmitting optical member 2 is irradiated with light (preferably ultraviolet light) and is final-cured. The pre-cured resin layer 5 is final-cured to sufficiently cure the pre-cured resin layer 5 so that the image display member 6 and the light transmitting optical member 2 are bonded and laminated. Thus, the image display member 6 and the light transmitting optical member 2 are laminated with the light transmitting cured resin layer 7 interposed therebetween to form an image display device 10 as shown in FIG. 1G. If necessary, the pre-cured resin layer 5 between the light shielding layer 1 of the light transmitting optical member 2 and the image display member 6 may be final-cured by irradiating the pre-cured resin layer 5 with light.

The final-curing is preferably performed so that the curing rate (gel fraction) of the light transmitting cured resin layer 7 is 90% or more, more preferably 95% or more. The conditions of the final-curing such as the type of the light source, output power, illuminance, integrated light quantity, and the like are not particularly limited, and a known photo-radical polymerization process condition of (meth) acrylate by irradiation with ultraviolet light may be employed. In particular, ultraviolet irradiation is preferably performed using an ultraviolet irradiator (metal halide lamps, high-pressure mercury, UV-LEDs, etc.) under a condition of an illuminance of 50 to 300 mW/cm$^2$ and an integrated light quantity of 1,000 to 3,000 mJ/cm$^2$.

Examples of the image display member 6 include a liquid crystal display panel, an organic EL display panel, a plasma display panel, and a touch panel. Here, the touch panel means an image display/input panel that combines a display element such as a liquid crystal display panel and a position input device such as a touch pad.

The light transmitting cured resin layer 7 preferably has a shear storage modulus of 2,000 to 320,000 Pa. It should be noted that the shear storage modulus of the light transmitting cured resin layer 7 is a value at 25° C. By setting the shear storage modulus of the light transmitting cured resin layer 7 within the above-mentioned range, the shear storage modulus of the pre-cured resin layer 5 before the final-curing can be in an appropriate range, that is, the pre-cured resin layer 5 can be in a low elasticity state. As a result, as shown in FIG. 1 (E), when the light transmitting optical member 2 is bonded to the image display member 6 on the side of the pre-cured resin layer 5, the light transmitting optical member 2 can be bonded at a lower bonding pressure, thus reducing damage caused by pressing the image display member 6 and the light transmitting optical member 2.

The light transmitting cured resin layer 7 may be in any configuration as long as it has a light transmitting property so that the image formed on the image display member 6 can be viewed therethrough.

As described above, in the first embodiment, an example was explained in which a photocurable resin composition is applied to the light shielding layer-forming side surface of the light transmitting optical member. In the following second embodiment, an example will be described in which a photocurable resin composition is applied to the surface of an image display member. It should be noted that, in the drawings, the same reference sign indicates the same component.

Second Embodiment

Hereinafter, a second embodiment of the method for manufacturing an image display device will be described in detail for each process step with reference to the drawings.
Step (A2)
In step (A2), a photocurable resin composition is applied to a surface of an image display member to form a photocurable resin composition layer.

Figure 2A:
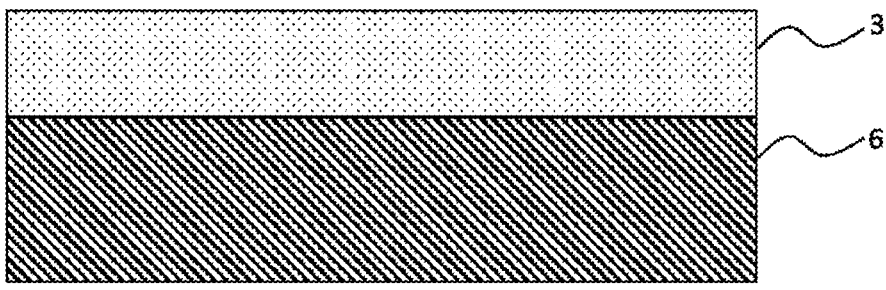
FIG. 2A is an explanatory view of a step (A2) of the method for manufacturing an image display device according to the present embodiment.

FIG. 2A is an explanatory view showing an example of the step (A2) of the method for manufacturing an image display device. As shown in FIG. 2A, a photocurable resin composition is applied to a surface of the image display member 6 so that the resulting surface is flat to form a photocurable resin composition layer 3. The thickness of the photocurable resin composition layer 3 is preferably selected to cancel the height difference formed between the light shielding layer and the light shielding layer-forming side surface of the light transmitting optical member. For example, the thickness of the photocurable resin composition layer 3 is preferably 2.5 to 40 times the thickness of the light shielding layer, more preferably 2.5 to 12.5 times, and still more preferably 2.5 to 4 times.

It should be noted that the application of the photocurable resin composition may be performed once or a plurality of times as long as a necessary thickness is achieved.
Step (B2)
In step (B2), the photocurable resin composition layer formed in step (A2) is irradiated with light to perform a pre-curing, thereby forming a pre-cured resin layer.

Figure 2B:
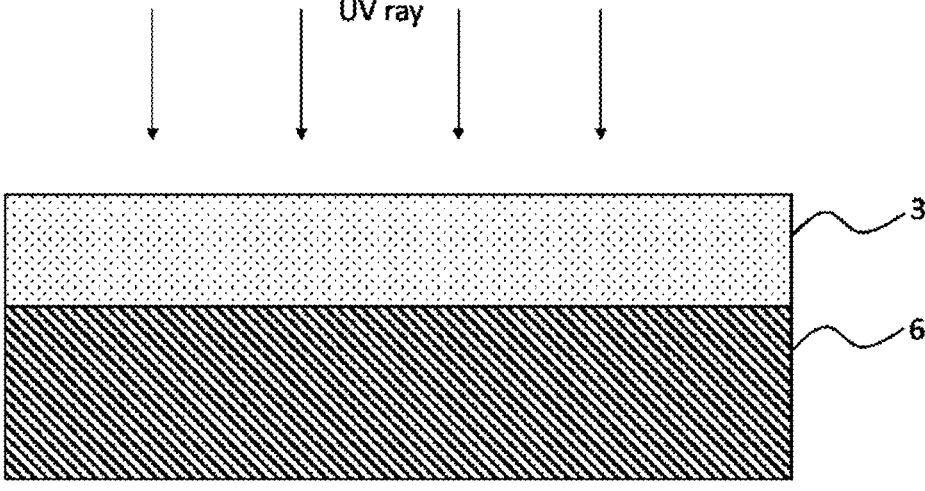
FIG. 2B is an explanatory view of a step (B2) of the method for manufacturing an image display device according to the present embodiment.
Figure 2C:
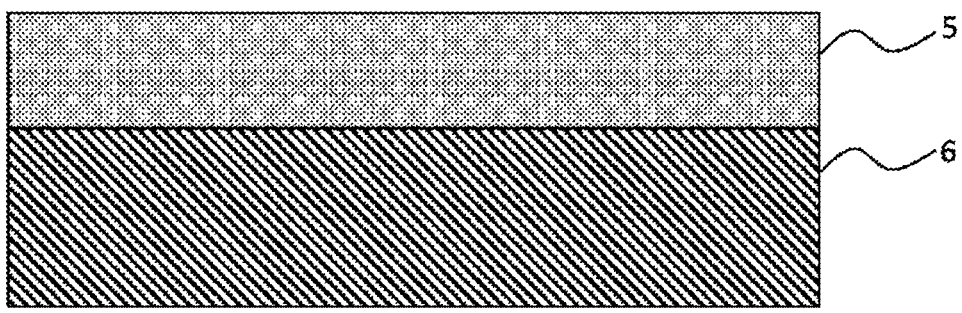
FIG. 2C is an explanatory view of a step (B2) of the method for manufacturing an image display device according to the present embodiment.

FIGS. 2B and 2C are explanatory views showing an example of the step (B2) of the method for manufacturing an image display device. As shown in FIG. 2B, the photocurable resin composition layer 3 formed in step (A2) is irradiated with light (preferably ultraviolet light) to cause pre-curing, thereby forming the pre-cured resin layer 5 (FIG. 2C). The pre-curing of the photocurable resin composition layer 3 is preferably performed so that the curing rate (gel fraction) of the pre-cured resin layer 5 is 10 to 90%, more preferably 40 to 90%, and still more preferably 70 to 90%.
Step (C2)
In step (C2), the image display member and the light transmitting optical member are bonded to each other via the pre-cured resin layer.

Figure 2D:
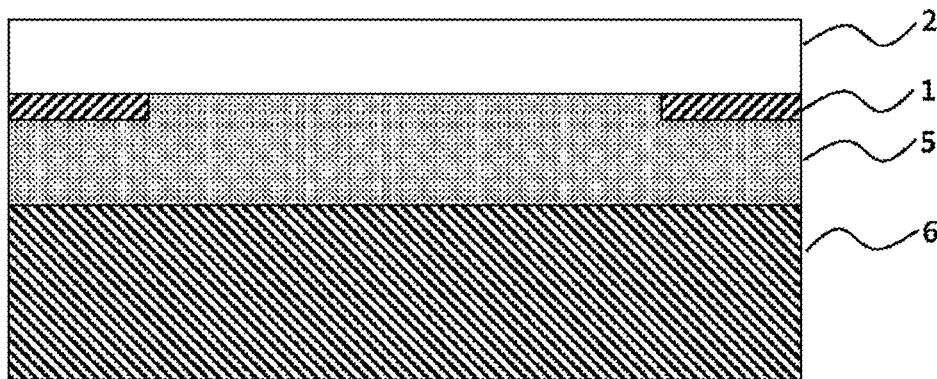
FIG. 2D is an explanatory view of a step (C2) of the method for manufacturing an image display device according to the present embodiment.

FIG. 2D is an explanatory view showing an example of the step (C2) of the method for manufacturing an image display device. As shown in FIG. 2D, the light transmitting optical member 2 is bonded to the pre-cured resin layer 5 of the image display member 6 on the light shielding layer 1 side. The bonding can be carried out, for example, by applying pressure at 10 to 80° C. using a known pressure bonding device.
Step (D2)
In step (D2), a pre-cured resin layer disposed between the image display member and the light transmitting optical member is irradiated with light and is final-cured, whereby the image display member and the light transmitting optical member are laminated via the light transmitting cured resin layer to complete an image display device.

Figures 2E, 2F:
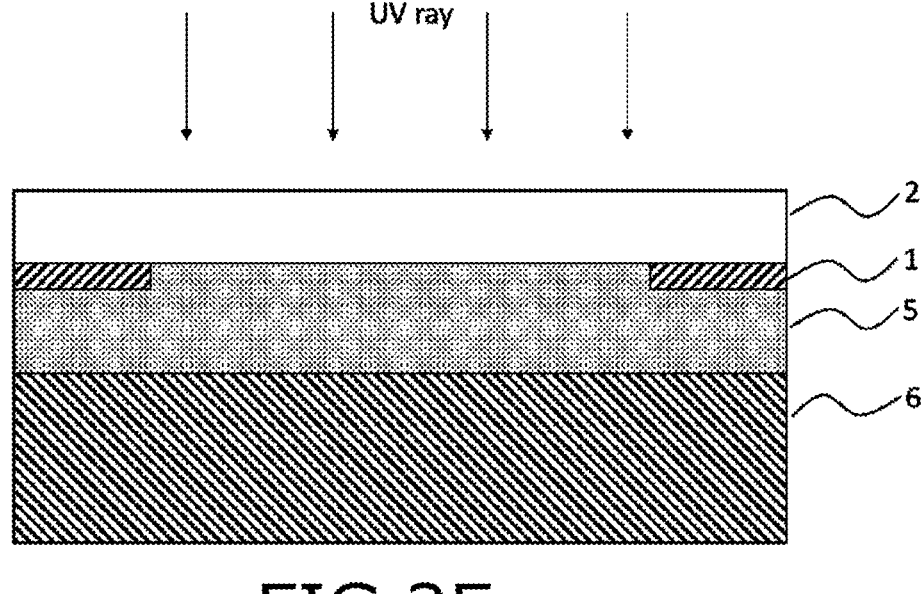
FIG. 2E is an explanatory view of a step (D2) of the method for manufacturing an image display device according to the present embodiment.
FIG. 2F is an explanatory view of a step (D2) of the method for manufacturing an image display device according to the present embodiment.

FIGS. 2E and 2F are explanatory views showing an example of the step (D2) of the method for manufacturing an image display device. As shown in FIG. 2E, the pre-cured resin layer 5 sandwiched between the image display member 6 and the light transmitting optical member 2 is irradiated with ultraviolet rays and is final-cured. Thus, the image display member 6 and the light transmitting optical member 2 are laminated with the light transmitting cured resin layer 7 interposed therebetween to form an image display device 10 as shown in FIG. 2F.

As described above, according to the present technology, the lifting phenomenon can be suppressed by containing a predetermined amount of a (meth)acrylate monomer having a ring structure as an acrylic monomer in the photocurable resin composition.

The photocurable resin composition according to the present embodiment is a photocurable resin composition used in the method for manufacturing an image display device according to the first embodiment or the second embodiment. The photocurable resin composition contains a total of 31 to 55 mass % of a radical polymerizable component containing an acrylic oligomer and an acrylic mono-mer and 40 to 66 mass % of a plasticizer, 8 to 19 mass % of a (meth)acrylate monomer having a ring structure as the acrylic monomer, and the shear storage modulus after curing is 1,000 to 320,000 Pa. With this configuration, the lifting phenomenon can be suppressed.

The light transmitting cured resin layer according to the present embodiment is a light transmitting cured resin layer used in the method for manufacturing an image display device according to the first embodiment or the second embodiment. The light transmitting cured resin layer con-tains a total of 31 to 55 mass % of a radical-polymerizable component containing an acrylic oligomer and an acrylic monomer, 40 to 66 mass % of a plasticizer, and 8 to 19 mass % of a (meth)acrylate monomer having a ring structure as the acrylic monomer, and having a shear storage modulus of 1,000 to 320,000 Pa. With this configuration, the lifting phenomenon can be suppressed.

EXAMPLES

Examples of the present technology will be described below. In this technology, an image display device is manu-factured by the method for manufacturing an image display device according to the first embodiment. Then, the lifting phenomenon of the pre-cured resin layer and the shear storage modulus of the light transmitting cured resin layer were evaluated. It should be noted that present technology is not limited to these examples.

In this example, the following compounds were used.

Acrylic Oligomer

Aliphatic urethane acrylate, product name: EBECRYL 230, available from Daicel Allnex (Meth)Acrylate Monomer Having a Ring Structure Dicyclopentenyloxyethyl acrylate, product name: FA-512 AS, available from Hitachi Chemical Company Dicyclopentanyl acrylate, product name: FA-513 AS, available from Hitachi Chemical Company Dicyclopentenyl acrylate, product name: FA-511 AS, available from Hitachi Chemical Company Isobornyl acrylate, product name: IBXA, available from Osaka Organic Chemical Industry Tetrahydrofurfuryl acrylate, product name: Biscoat #150, available from Osaka Organic Chemical Benzyl acrylate, product name: Biscoat #160, available from Osaka Organic Chemical Other Acrylic Monomers 4-hydroxybutyl acrylate; product name: 4-HBA; available from BASF Lauryl acrylate, product name: LA, available from Osaka Organic Chemical Industry n-octyl acrylate; product name: NOAA, available from Osaka Organic Chemical Industry Isodecyl acrylate; product name: FA-111A, available from Hitachi Chemical Company Hydroxypropyl methacrylate; product name: Acriester HP (HPMA), available from Mitsubishi Rayon Isostearyl acrylate, product name: ISTA, available from Osaka Organic Chemical Octyl/decyl acrylate, product name: ODA-N, available from Daicel Allnex Plasticizer Hydrogenated polybutadiene having hydroxy groups at both terminal ends, product name: GI-1000, GI-3000, avail-able from Nippon Soda

Hydrogenated polybutadiene having hydroxy groups at both terminal ends, product name: KRASOL LBH-P-3000, available from CRAY VALLEY Terpene resin, product name: Clearon M105, available from Yasuhara Chemical Photopolymerization initiator 2,4,6-trimethylbenzoyl-diphenyl-phosphine oxide, prod-uct name LUCIRIN TPO, available from BASF 1-hydroxy-cyclohexyl-phenyl-ketone, product name: Irgacure 184, available from BASF Additive 3-methacryloxypropyltrimethoxysilane, product name: KBM-503, available from Shin-Etsu Silicone 3-mercaptopropyltrimethoxysilane, product name: KBM-803, available from Shin-Etsu Silicone Hindered phenolic antioxidant, product name: IRGANOX 1010, available from BASF

Example 1

Step (A): Step of Forming a Photocurable Resin Composi-tion Layer

After preparing a glass plate having a size of 45 (w)×80 (1)×0.4 (t) mm, a light shielding layer having a width of 4 mm is applied on the entire periphery of the glass plate by a screen printing method using a thermosetting black ink (MRX ink available from Teikoku Ink Mfg.) and drying the light shielding layer so as to achieve an after-drying thick-ness of 40 μm to prepare a glass plate with a light shielding layer.

The following components were uniformly mixed to prepare a photocurable resin composition.

Acrylic Oligomer

Aliphatic urethane acrylate: 10 parts by mass (Meth)Acrylate Monomer Having a Ring Structure Dicyclopentenyloxyethyl acrylate: 8.5 parts by mass Other Acrylic Monomers 4-hydroxybutyl acrylate, lauryl acrylate, n-octyl acrylate, and isodecyl acrylate: 27 parts by mass in total Plasticizer Hydrogenated polybutadiene having hydroxy groups at both terminal ends (product name: GI-1000, GI-3000, KRASOL LBH-P-3000) and terpene resin: 51 parts by mass in total Photopolymerization Initiator 2,4,6-trimethylbenzoyl-diphenyl-phosphine oxide and 1-hydroxy-cyclohexyl-phenyl-ketone: 3 parts by mass in total Additive 3-methacryloxypropyltrimethoxysilane, 3-mercaptopro-pyltrimethoxysilane, and hindered phenolic antioxidant: 0.5 parts by mass in total The prepared photocurable resin composition was dis-charged onto the entire surface of the light shielding layer-forming side surface of the glass plate with the light shield-ing layer by using a resin dispenser to form a photocurable resin composition layer having an average thickness of 150 μm.

Step (B): Step of Forming a Pre-Cured Resin Layer

The photocurable resin composition layer was pre-cured by irradiating the photocurable resin composition layer with ultraviolet light of 170 mW/cm² intensity using an ultravio-let irradiation device (UV-LED, product name H-16 LH4-V1-SM1, available from HOYA CANDEO OPTRONICS) so that the integrated light quantity was 280 mJ/cm², thereby forming a pre-cured resin layer.

The curing rate of the pre-cured resin layer was about 80 to 90% as determined using an absorption peak height of 1,640 to 1,620 cm$^{-1}$ from the baseline in the FT-IR measurement chart as an index.

Step (C): Step of Bonding

The glass plate obtained in the step (B) was placed on a surface where a polarizing plate of a liquid crystal display element having a size of 40 (W)×70 (L) mm was laminated so that the pre-cured resin layer side of the glass plate was on the polarizing plate side, and the glass plate was pressed by a rubber roller on the glass plate side to bond the glass plate.

Step (D): Step of Final-Curing

The liquid crystal display element obtained in step (C) was irradiated with ultraviolet rays (200 mW/cm$^2$) from the glass plate side by using an ultraviolet irradiation device (metal halide lamps available from USHIO) so that the integrated light quantity was 1,000 mJ/cm$^2$ or more, and the pre-cured resin layer was final-cured to form a light transmitting cured resin layer. The curing rate of the light transmitting cured resin layer was 97%. Thus, a liquid crystal display device was obtained in which a glass plate as a light transmitting optical member was laminated on a liquid crystal display element via a light transmitting cured resin layer.

Example 2

A liquid crystal display device was prepared in the same manner as in Example 1 except that the composition of the photocurable resin composition in Example 1 was changed as follows.
Acrylic Oligomer
    Aliphatic urethane acrylate: 6 parts by mass
(Meth)Acrylate Monomer Having a Ring Structure
    Dicyclopentenyloxyethyl acrylate: 8 parts by mass
Other Acrylic Monomers
    4-hydroxybutyl acrylate, lauryl acrylate, n-octyl acrylate, and isodecyl acrylate: 28 parts by mass in total
Plasticizer
    Hydrogenated polybutadiene having hydroxy groups at both terminal ends (product name: GI-1000, GI-3000, KRASOL LBH-P-3000) and terpene resin: 54.6 parts by mass in total
Photopolymerization Initiator
    2,4,6-trimethylbenzoyl-diphenyl-phosphine oxide and 1-hydroxy-cyclohexyl-phenyl-ketone: 3 parts by mass in total
Additive
    3-methacryloxypropyltrimethoxysilane, 3-mercaptopropyltrimethoxysilane, and hindered phenolic antioxidant: 0.4 parts by mass in total Example 3

A liquid crystal display device was prepared in the same manner as in Example 1 except that the composition of the photocurable resin composition in Example 1 was changed as follows.
Acrylic Oligomer
    Aliphatic urethane acrylate: 19 parts by mass
(Meth)Acrylate Monomer Having a Ring Structure
    Dicyclopentenyloxyethyl acrylate: 8 parts by mass
    Isobornyl acrylate: 6 parts by mass
    Benzyl acrylate: 5 parts by mass
Other Acrylic Monomers 4-hydroxybutyl acrylate, lauryl acrylate, and hydroxypropyl methacrylate: 17 parts by mass in total
Plasticizer
    Hydrogenated polybutadiene having hydroxy groups at both terminal ends (product name: GI-1000, GI-3000, KRASOL LBH-P-3000) and terpene resin: 40.6 parts by mass in total
Photopolymerization Initiator
    2,4,6-trimethylbenzoyl-diphenyl-phosphine oxide and 1-hydroxy-cyclohexyl-phenyl-ketone: 3.8 parts by mass in total
Additive
    3-methacryloxypropyltrimethoxysilane, 3-mercaptopropyltrimethoxysilane, and hindered phenolic antioxidant: 0.6 parts by mass in total Example 4

A liquid crystal display device was prepared in the same manner as in Example 1 except that the composition of the photocurable resin composition in Example 1 was changed as follows.
Acrylic Oligomer
    Aliphatic urethane acrylate: 11 parts by mass
(Meth)Acrylate Monomer Having a Ring Structure
    Dicyclopentenyl acrylate: 8.8 parts by mass
Other Acrylic Monomers
    4-hydroxybutyl acrylate, lauryl acrylate, n-octyl acrylate, and isodecyl acrylate: 25 parts by mass in total
Plasticizer
    Hydrogenated polybutadiene having hydroxy groups at both terminal ends (product name: GI-1000, GI-3000, KRASOL LBH-P-3000) and terpene resin: 52.85 parts by mass in total
Photopolymerization Initiator
    2,4,6-trimethylbenzoyl-diphenyl-phosphine oxide and 1-hydroxy-cyclohexyl-phenyl-ketone: 2 parts by mass in total
Additive
    3-methacryloxypropyltrimethoxysilane, 3-mercaptopropyltrimethoxysilane, and hindered phenolic antioxidant: 0.35 parts by mass in total Example 5

A liquid crystal display device was prepared in the same manner as in Example 4, except that an equal amount of dicyclopentanyl acrylate was used instead of dicyclopentenyl acrylate in the composition of the photocurable resin composition in Example 4.

Example 6

A liquid crystal display device was prepared in the same manner as in Example 4, except that an equal amount of isobornyl acrylate was used instead of dicyclopentenyl acrylate in the composition of the photocurable resin composition in Example 4.

Example 7

A liquid crystal display device was prepared in the same manner as in Example 4, except that an equal amount of tetrahydrofurfuryl acrylate was used instead of dicyclopentenyl acrylate in the composition of the photocurable resin composition in Example 4.

Example 8

A liquid crystal display device was prepared in the same manner as in Example 4, except that an equal amount of benzyl acrylate was used instead of dicyclopentenyl acrylate in the composition of the photocurable resin composition in Example 4.

Example 9

A liquid crystal display device was prepared in the same manner as in Example 1 except that the composition of the photocurable resin composition in Example 1 was changed as follows.
Acrylic Oligomer
    Aliphatic urethane acrylate: 10.85 parts by mass
(Meth)Acrylate Monomer Having a Ring Structure
    Dicyclopentenyl acrylate: 8.8 parts by mass
Other Acrylic Monomers
    4-hydroxybutyl acrylate and lauryl acrylate: 12 parts by mass in total
Plasticizer
    Hydrogenated polybutadiene having hydroxy groups at both terminal ends (product name: GI-1000, GI-3000, KRASOL LBH-P-3000) and terpene resin: 66 parts by mass in total
Photopolymerization Initiator
    2,4,6-trimethylbenzoyl-diphenyl-phosphine oxide and 1-hydroxy-cyclohexyl-phenyl-ketone: 2 parts by mass in total
Additive
    3-methacryloxypropyltrimethoxysilane, 3-mercaptopropyltrimethoxysilane, and hindered phenolic antioxidant: 0.35 parts by mass in total

Example 10

A liquid crystal display device was prepared in the same manner as in Example 1 except that the composition of the photocurable resin composition in Example 1 was changed as follows.
Acrylic Oligomer
    Aliphatic urethane acrylate: 14 parts by mass
(Meth)Acrylate Monomer Having a Ring Structure
    Dicyclopentenyloxyethyl acrylate: 9 parts by mass
Other Acrylic Monomers
    4-hydroxybutyl acrylate and lauryl acrylate: 34.65 parts by mass in total
Plasticizer
    Hydrogenated polybutadiene having hydroxy groups at both terminal ends (product name: GI-1000, GI-3000, KRASOL LBH-P-3000) and terpene resin: 40 parts by mass in total
Photopolymerization Initiator
    2,4,6-trimethylbenzoyl-diphenyl-phosphine oxide and 1-hydroxy-cyclohexyl-phenyl-ketone: 2 parts by mass in total
Additive
    3-methacryloxypropyltrimethoxysilane and hindered phenolic antioxidant: 0.35 parts by mass in total

Comparative Example 1

A liquid crystal display device was prepared in the same manner as in Example 1 except that the composition of the photocurable resin composition in Example 1 was changed as follows.

Acrylic Oligomer
    Aliphatic urethane acrylate: 10.3 parts by mass
Other Acrylic Monomers
    4-hydroxybutyl acrylate, lauryl acrylate, n-octyl acrylate, isodecyl acrylate, and isostearyl acrylate: 36 parts by mass in total
Plasticizer
    Hydrogenated polybutadiene having hydroxy groups at both terminal ends (product name: GI-1000, GI-3000, KRASOL LBH-P-3000) and terpene resin: 51.4 parts by mass in total
Photopolymerization Initiator
    2,4,6-trimethylbenzoyl-diphenyl-phosphine oxide and 1-hydroxy-cyclohexyl-phenyl-ketone: 2 parts by mass in total
Additive
    3-methacryloxypropyltrimethoxysilane, 3-mercaptopropyltrimethoxysilane, and hindered phenolic antioxidant: 0.3 parts by mass in total

Comparative Example 2

A liquid crystal display device was prepared in the same manner as in Example 1 except that the composition of the photocurable resin composition in Example 1 was changed as follows.
Acrylic Oligomer
    Aliphatic urethane acrylate: 10.1 parts by mass
(Meth)Acrylate Monomer Having a Ring Structure
    Dicyclopentenyloxyethyl acrylate: 0.8 parts by mass
Other Acrylic Monomers
    4-hydroxybutyl acrylate, lauryl acrylate, n-octyl acrylate, and isodecyl acrylate: 30 parts by mass in total
Plasticizer
    Hydrogenated polybutadiene having hydroxy groups at both terminal ends (product name: GI-1000, GI-3000, KRASOL LBH-P-3000) and terpene resin: 55.7 parts by mass in total
Photopolymerization Initiator
    2,4,6-trimethylbenzoyl-diphenyl-phosphine oxide and 1-hydroxy-cyclohexyl-phenyl-ketone: 3 parts by mass in total
Additive
    3-methacryloxypropyltrimethoxysilane, 3-mercaptopropyltrimethoxysilane, and hindered phenolic antioxidant: 0.4 parts by mass in total

Comparative Example 3

A liquid crystal display device was prepared in the same manner as in Example 4, except that an equal amount of lauryl acrylate was used instead of dicyclopentenyl acrylate in the composition of the photocurable resin composition in Example 4.

Comparative Example 4

A liquid crystal display device was prepared in the same manner as in Example 4, except that an equal amount of n-octyl acrylate was used instead of dicyclopentenyl acrylate in the composition of the photocurable resin composition in Example 4.

Comparative Example 5

A liquid crystal display device was prepared in the same manner as in Example 4, except that an equal amount of octyl/decyl acrylate was used instead of dicyclopentenyl acrylate in the composition of the photocurable resin composition in Example 4.

Comparative Example 6

A liquid crystal display device was prepared in the same manner as in Example 4, except that an equal amount of isostearyl acrylate was used instead of dicyclopentenyl acrylate in the composition of the photocurable resin composition in Example 4.

Comparative Example 7

A liquid crystal display device was prepared in the same manner as in Example 4, except that an equal amount of isodecyl acrylate was used instead of dicyclopentenyl acrylate in the composition of the photocurable resin composition in Example 4.

Comparative Example 8

A liquid crystal display device was prepared in the same manner as in Example 1 except that the composition of the photocurable resin composition in Example 1 was changed as follows.
Acrylic Oligomer
    Aliphatic urethane acrylate: 10.6 parts by mass
Other Acrylic Monomers
    4-hydroxybutyl acrylate, lauryl acrylate, n-octyl acrylate, and isodecyl acrylate: 34 parts by mass in total
Plasticizer
    Terpene resin: 53 parts by mass
Photopolymerization Initiator
    2,4,6-trimethylbenzoyl-diphenyl-phosphine oxide and 1-hydroxy-cyclohexyl-phenyl-ketone: 2.1 parts by mass in total
Additive
    3-methacryloxypropyltrimethoxysilane and hindered phenolic antioxidant: 0.3 parts by mass in total

Comparative Example 9

A liquid crystal display device was prepared in the same manner as in Comparative Example 7, except that, in step (B) of Comparative Example 7, a photocurable resin composition layer was pre-cured by irradiating ultraviolet light of 344 mW/cm² intensity so that the integrated light quantity was 290 mJ/cm², thereby forming a pre-cured resin layer.

Comparative Example 10

A liquid crystal display device was prepared in the same manner as in Comparative Example 7, except that, in step (B) of Comparative Example 7, a photocurable resin composition layer was pre-cured by irradiating ultraviolet light of 513 mW/cm² intensity so that the integrated light quantity was 297 mJ/cm², thereby forming a pre-cured resin layer.

Comparative Example 11

A liquid crystal display device was prepared in the same manner as in Comparative Example 7, except that, in step (B) of Comparative Example 7, a photocurable resin composition layer was pre-cured by irradiating ultraviolet light of 852 mW/cm² intensity so that the integrated light quantity was 309 mJ/cm², thereby forming a pre-cured resin layer.

Comparative Example 12

A liquid crystal display device was prepared in the same manner as in Comparative Example 7, except that, in step (B) of Comparative Example 7, a photocurable resin composition layer was pre-cured by irradiating ultraviolet light of 852 mW/cm² intensity so that the integrated light quantity was 3,696 mJ/cm², thereby forming a pre-cured resin layer.

Comparative Example 13

Figure 3:
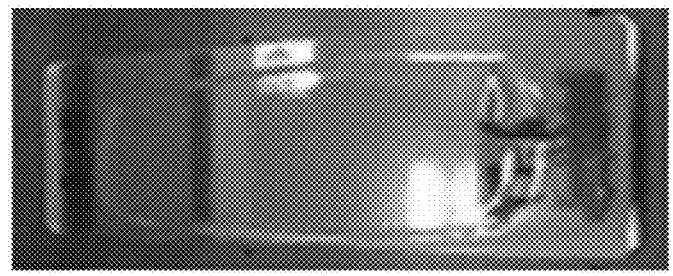
FIG. 3 is a plan view showing an example of an appearance of a pre-cured resin layer when the evaluation of the lifting phenomenon is OK.
Figure 4:
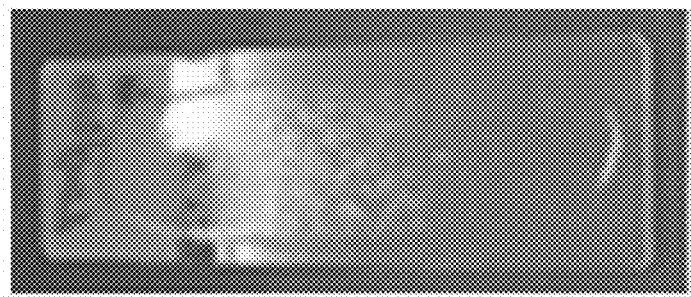
FIG. 4 is a plan view showing an example of an appearance of a pre-cured resin layer when the evaluation of the lifting phenomenon is NG.

A liquid crystal display device was prepared in the same manner as in Comparative Example 7, except that, in step (B) of Comparative Example 7, a photocurable resin composition layer was pre-cured by irradiating ultraviolet light of 170 mW/cm² intensity so that the integrated light quantity was 1,169 mJ/cm², thereby forming a pre-cured resin layer.
Presence or Absence of Lifting Phenomenon of the Pre-Cured Resin Layer
    In the step (B) of each Example and Comparative Example, the appearance of the pre-cured resin layer was observed and the presence or absence of the lifting phenomenon was evaluated. When the lifting phenomenon did not occur, it was evaluated as OK, and when the lifting phenomenon occurred, it was evaluated as NG. FIG. 3 is a plan view showing an example of the appearance of the pre-cured resin layer when the evaluation of the lifting phenomenon is OK. FIG. 4 is a plan view showing an example of the appearance of the pre-cured resin layer when the evaluation of the lifting phenomenon is NG. The results are shown in the following table.
Shear Storage Modulus of the Light Transmitting Cured Resin Layer
    The shear storage modulus of the light transmitting cured resin layer was calculated using a viscoelasticity measuring device. The measurement conditions were set to a measurement temperature range of 20 to 25° C., a frequency of 1 Hz, and a strain of 0.1%. The results are shown in the following table.

TABLE 1

| | | | | EX. 1 | EX. 2 | EX. 3 | EX. 4 | EX. 5 |
|---|---|---|---|---|---|---|---|---|
| content (mass %) | radical polymerizable component | Acrylic oligomer | | 10 | 6 | 19 | 11 | 11 |
| | | acrylic monomer | (meth)acrylate monomer having ring structure | dicyclopentenyl-oxyethyl acrylate | 8.5 | 8 | 8 | — | — |
| | | | | dicyclopentenyl acrylate | — | — | — | 8.8 | — |
| | | | | dicyclopentanyl acrylate | — | — | — | — | 8.8 |
| | | | | isobornyl acrylate | — | — | 6 | — | — |
| | | | | tetrahydrofurfuryl acrylate | — | — | — | — | — |

TABLE 1-continued

| | EX. (continued) | | | | |
|---|---|---|---|---|---|
| benzyl acrylate | — | — | 5 | — | — |
| other acrylic monomers | 27 | 28 | 17 | 25 | 25 |
| plasticizer | 51 | 54.6 | 40.6 | 52.85 | 52.85 |
| photopolymerization initiator | 3 | 3 | 3.8 | 2 | 2 |
| additive | 0.5 | 0.4 | 0.6 | 0.35 | 0.35 |
| pre-curing step illuminance (mW/cm$^2$) | 170 | 170 | 170 | 170 | 170 |
| integrated light quantity (mJ/cm$^2$) | 280 | 280 | 280 | 280 | 280 |
| shear storage modulus of light transmitting cured resin layer (Pa) | 2500 | 2400 | 24200 | 10500 | 2900 |
| presence or absence of lifting phenomenon of the pre-cured resin layer | OK | OK | OK | OK | OK |

| | EX. 6 | EX. 7 | EX. 8 | EX. 9 | EX. 10 |
|---|---|---|---|---|---|
| content (mass %) radical polymerizable component acrylic monomer (meth)acrylate monomer having ring structure — Acrylic oligomer | 11 | 11 | 11 | 10.85 | 14 |
| dicyclopentenyl-oxyethyl acrylate | — | — | — | — | 9 |
| dicyclopentenyl acrylate | — | — | — | 8.8 | — |
| dicyclopentanyl acrylate | — | — | — | — | — |
| isobornyl acrylate | 8.8 | — | — | — | — |
| tetrahydrofurfuryl acrylate | — | 8.8 | — | — | — |
| benzyl acrylate | — | — | 8.8 | — | — |
| other acrylic monomers | 25 | 25 | 25 | 12 | 34.65 |
| plasticizer | 52.85 | 52.85 | 52.85 | 66 | 40 |
| photopolymerization initiator | 2 | 2 | 2 | 2 | 2 |
| additive | 0.35 | 0.35 | 0.35 | 0.35 | 0.35 |
| pre-curing step illuminance (mW/cm$^2$) | 170 | 170 | 170 | 170 | 170 |
| integrated light quantity (mJ/cm$^2$) | 280 | 280 | 280 | 280 | 280 |
| shear storage modulus of light transmitting cured resin layer (Pa) | 2400 | 2500 | 2500 | 5200 | 320000 |
| presence or absence of lifting phenomenon of the pre-cured resin layer | OK | OK | OK | OK | OK |

| | Comp. 1 | Comp. 2 | Comp. 3 | Comp. 4 | Comp. 5 | Comp. 6 | Comp. 7 |
|---|---|---|---|---|---|---|---|
| content (mass %) radical polymerizable component acrylic monomer (meth)acrylate monomer having ring structure — Acrylic oligomer | 10.3 | 10.1 | 10.6 | 10.6 | 10.6 | 10.6 | 10.6 |
| dicyclopentenyl-oxyethyl acrylate | — | 0.8 | — | — | — | — | — |
| dicyclopentenyl acrylate | — | — | — | — | — | — | — |
| dicyclopentanyl acrylate | — | — | — | — | — | — | — |
| isobornyl acrylate | — | — | — | — | — | — | — |
| tetrahydrofurfuryl acrylate | — | — | — | — | — | — | — |
| benzyl acrylate | — | — | — | — | — | — | — |
| other acrylic monomers | 36 | 30 | 34 | 34 | 34 | 34 | 34 |
| plasticizer | 51.4 | 55.7 | 53 | 53 | 52.9 | 53 | 53 |
| photopolymerization initiator | 2 | 3 | 2.1 | 2 | 2.1 | 2.1 | 2.1 |
| additive | 0.3 | 0.4 | 0.3 | 0.4 | 0.4 | 0.3 | 0.3 |
| pre-curing step illuminance (mW/cm$^2$) | 170 | 170 | 170 | 170 | 170 | 170 | 170 |
| integrated light quantity (mJ/cm$^2$) | 280 | 280 | 280 | 280 | 280 | 280 | 280 |
| shear storage modulus of light transmitting cured resin layer (Pa) | 1400 | 2400 | 1140 | 1130 | 1800 | 1530 | 1090 |
| presence or absence of lifting phenomenon of the pre-cured resin layer | NG | NG | NG | NG | NG | NG | NG |

| | Comp. 8 | Comp. 9 | Comp. 10 | Comp. 11 | Comp. 12 | Comp. 13 |
|---|---|---|---|---|---|---|
| content (mass %) radical polymerizable component acrylic monomer (meth)acrylate monomer having ring structure — Acrylic oligomer | 10.6 | 10.6 | 10.6 | 10.6 | 10.6 | 10.6 |
| dicyclopentenyl-oxyethyl acrylate | — | — | — | — | — | — |
| dicyclopentenyl acrylate | — | — | — | — | — | — |
| dicyclopentanyl acrylate | — | — | — | — | — | — |
| isobornyl acrylate | — | — | — | — | — | — |
| tetrahydrofurfuryl acrylate | — | — | — | — | — | — |
| benzyl acrylate | — | — | — | — | — | — |
| other acrylic monomers | 34 | 34 | 34 | 34 | 34 | 34 |
| plasticizer | 53 | 53 | 53 | 53 | 53 | 53 |
| photopolymerization initiator | 2.1 | 2.1 | 2.1 | 2.1 | 2.1 | 2.1 |
| additive | 0.3 | 0.3 | 0.3 | 0.3 | 0.3 | 0.3 |
| pre-curing step illuminance (mW/cm$^2$) | 170 | 344 | 513 | 852 | 852 | 170 |
| integrated light quantity (mJ/cm$^2$) | 280 | 290 | 297 | 309 | 3696 | 1169 |
| shear storage modulus of light transmitting cured resin layer (Pa) | 320000 | 1090 | 1090 | 1090 | 1090 | 1090 |
| presence or absence of lifting phenomenon of the pre-cured resin layer | NG | NG | NG | NG | NG | NG |

It has been found that, as in Examples 1 to 10, when a photocurable resin composition contains a total of 31 to 55 mass % of a radical polymerizable component containing an acrylic oligomer and an acrylic monomer and 40 to 66 mass % of a plasticizer, the acrylic monomer contains 5 to 19 mass % of a (meth)acrylate monomer having a cyclic hydrocarbon group, and the shear storage modulus of the light transmitting cured resin layer is 1,000 to 320,000, the lifting phenomenon can be suppressed.

In contrast, it was found that lifting phenomenon occurs when the photocurable resin composition does not contain a (meth)acrylate monomer having a ring structure as in Comparative Examples 1 and 3 to 7.

In addition, it was found that lifting phenomenon occurs when the content of the (meth)acrylate monomer having a ring structure in the photocurable resin composition is less than 5 mass % as in Comparative Example 2.

Moreover, it was found that lifting phenomenon occurs even if the photocurable resin composition is prepared so that the shear storage modulus of the light transmitting cured resin layer after the final-curing is increased, when the photocurable resin composition does not contain a (meth)acrylate monomer having a ring structure as in Comparative Example 8.

It was found that the lifting phenomenon occurs even if the illuminance and the integrated light quantity of the ultraviolet rays used for the pre-curing of the photocurable resin composition are changed when the photocurable resin composition does not contain a (meth)acrylate monomer having a ring structure as in Comparative Example 9 to 12.

REFERENCE SIGNS LIST

1 Light shielding layer, 2 light transmitting optical member, 2a light shielding layer-forming side surface, 3 photocurable resin composition layer, 4 height difference, 5 pre-cured resin layer, 6 image display member, 7 light transmitting cured resin layer, 10 image display device

The invention claimed is:

1. A photocurable resin composition, comprising:
   a total of 31 to 55 mass % of a radical polymerizable component containing an acrylic oligomer and an acrylic monomer and 40 to 66 mass % of a plasticizer;
   5 to 12 mass % of a (meth)acrylate monomer having a ring structure as the acrylic monomer; and
   a total of 2 to 3.8 mass % of all photopolymerization initiators,
   wherein the photocurable resin composition contains 6 to 11 mass % of the acrylic oligomer, and
   wherein a shear storage modulus of the photocurable resin composition after curing is 2,400 to 10,500 Pa at 25° C.

2. The photocurable resin composition of claim 1, wherein the acrylic oligomer is aliphatic urethane (meth) acrylate.

3. The photocurable resin composition of claim 1, wherein the (meth)acrylate monomer having the ring structure has at least one selected from the group consisting of an alicyclic hydrocarbon group, an aromatic hydrocarbon group, and a heterocycle as the ring structure.

4. The photocurable resin composition of claim 3, wherein the (meth)acrylate monomer having the ring structure has a heterocyclic ring as the ring structure with at least a sulfur atom and a number of carbon atoms constituting the heterocycle is 3 to 8.

5. The photocurable resin composition of claim 1, wherein the photocurable resin composition contains 51 to 66 mass % of a plasticizer.

6. A light transmitting cured resin layer in which a composition including the following components has cured: a total of 31 to 55 mass % of a radical-polymerizable component containing an acrylic oligomer and an acrylic monomer, 6 to 11 mass % of the acrylic oligomer, 40 to 66 mass % of a plasticizer, a total of 2 to 3.8 mass % of all photopolymerization initiators, and 5 to 12 mass % of a (meth)acrylate monomer having a ring structure as the acrylic monomer, and having a shear storage modulus of 2,400 to 10,500 Pa at 25° C.

7. The light transmitting cured resin layer of claim 6, wherein the acrylic oligomer is aliphatic urethane (meth) acrylate.

8. The photocurable resin composition of claim 6, wherein the photocurable resin composition contains 51 to 66 mass % of a plasticizer.

9. A method for manufacturing an image display device, comprising:
   a step (A) of applying a photocurable resin composition to a surface of a light transmitting optical member or a surface of an image display member to form a photocurable resin composition layer;
   a step (B) of pre-curing by irradiating the photocurable resin composition layer with light to form a pre-cured resin layer;
   a step (C) of bonding the image display member and the light transmitting optical member via the pre-cured resin layer; and
   a step (D) of obtaining an image display device by irradiating light to the pre-cured resin layer disposed between the image display member and the light transmitting optical member to final-cure the pre-cured resin layer to yield a light transmitting cured resin layer, thereby laminating the image display member and the light transmitting optical member via the light transmitting cured resin layer,
   wherein the photocurable resin composition contains a total of 31 to 55 mass % of a radical polymerizable component containing an acrylic oligomer and an acrylic monomer, 6 to 11 mass % of the acrylic oligomer, 40 to 66 mass % of a plasticizer, a total of 2 to 3.8 mass % of all photopolymerization initiators, and 5 to 12 mass % of a (meth)acrylate monomer having a ring structure as the acrylic monomer, and
   wherein the light transmitting cured resin layer has a shear storage modulus of 2,400 to 10,500 Pa at 25° C.

10. The method for manufacturing an image display device according to claim 9,
   wherein the (meth)acrylate monomer having the ring structure has at least one selected from the group consisting of an alicyclic hydrocarbon group, an aromatic hydrocarbon group, and a heterocycle as the ring structure.

11. The method for manufacturing an image display device according to claim 9, wherein the photocurable resin composition contains 8 to 10 mass % of the (meth)acrylate monomer having the ring structure.

12. The method for manufacturing an image display device according to claim 9, wherein in the step (B), the photocurable resin composition layer is irradiated with ultraviolet rays to pre-cure the photocurable resin composition layer so that the curing rate of the pre-cured resin layer is 70 to 90%.

13. The method for manufacturing an image display device according to claim 9, wherein in the step (B), light irradiation is performed using a UV-LED under conditions of an illuminance of 100 to 300 mW/cm$^2$ and an integrated light quantity of 100 to 300 mJ/cm$^2$.

14. The method for manufacturing an image display device according to claim 9, wherein in the step (D), the pre-cured resin layer is final-cured by irradiating the pre-cured resin layer with ultraviolet rays so that the curing rate of the light transmitting cured resin layer is 90% or more.

15. The method for manufacturing an image display device according to claim 9, wherein the image display member is a liquid crystal display panel, an organic EL display panel, a plasma display panel, or a touch panel.

16. The method for manufacturing an image display device according to claim 10, wherein the photocurable resin composition contains 8 to 10 mass % of the (meth) acrylate monomer having the ring structure.

17. The method for manufacturing an image display device according to claim 10, wherein in the step (B), the photocurable resin composition layer is irradiated with ultraviolet rays to pre-cure the photocurable resin composition layer so that the curing rate of the pre-cured resin layer is 70 to 90%.

18. The method for manufacturing an image display device according to claim 10, wherein in the step (B), light irradiation is performed using a UV-LED under conditions of an illuminance of 100 to 300 mW/cm$^2$ and an integrated light quantity of 100 to 300 mJ/cm$^2$.

19. The method for manufacturing an image display device according to claim 11, wherein in the step (B), the photocurable resin composition layer is irradiated with ultraviolet rays to pre-cure the photocurable resin composition layer so that the curing rate of the pre-cured resin layer is 70 to 90%.

20. The method for manufacturing an image display device according to claim 11, wherein in the step (B), light irradiation is performed using a UV-LED under conditions of an illuminance of 100 to 300 mW/cm$^2$ and an integrated light quantity of 100 to 300 mJ/cm$^2$.

21. The method for manufacturing an image display device according to claim 12, wherein in the step (B), light irradiation is performed using a UV-LED under conditions of an illuminance of 100 to 300 mW/cm$^2$ and an integrated light quantity of 100 to 300 mJ/cm$^2$.

\* \* \* \* \*